(12) United States Patent
Chen et al.

(10) Patent No.: US 7,659,534 B2
(45) Date of Patent: Feb. 9, 2010

(54) PROGRAMMABLE VIA DEVICES WITH AIR GAP ISOLATION

(75) Inventors: Kuan-Neng Chen, White Plains, NY (US); Lia Krusin-Elbaum, Dobbs Ferry, NY (US); Dennis M. Newns, Yorktown Heights, NY (US); Sampath Purushothaman, Yorktown Heights, NY (US)

(73) Assignee: International Business Machines Corporation, Armonk, NY (US)

( * ) Notice: Subject to any disclaimer, the term of this patent is extended or adjusted under 35 U.S.C. 154(b) by 167 days.

(21) Appl. No.: 11/833,354

(22) Filed: Aug. 3, 2007

(65) Prior Publication Data

US 2009/0033360 A1 Feb. 5, 2009

(51) Int. Cl.
*H01L 47/00* (2006.01)
(52) U.S. Cl. ............. 257/3; 257/4; 257/5; 257/E45.002
(58) Field of Classification Search ...................... 257/3, 257/4, 5, E45.002
See application file for complete search history.

(56) References Cited

U.S. PATENT DOCUMENTS

| | | | |
|---|---|---|---|
| 6,795,338 | B2 | 9/2004 | Parkinson et al. |
| 6,839,263 | B2 | 1/2005 | Fricke et al. |
| 6,967,344 | B2 | 11/2005 | Ovshinsky et al. |
| 7,057,923 | B2 | 6/2006 | Furkay et al. |
| 7,214,957 | B2 | 5/2007 | Ryoo et al. |
| 7,214,958 | B2 | 5/2007 | Happ |
| 2006/0097240 | A1 | 5/2006 | Lowrey et al. |
| 2006/0097343 | A1 | 5/2006 | Parkinson |
| 2007/0057341 | A9 | 3/2007 | Pellizzer |
| 2007/0096071 | A1 | 5/2007 | Kordus et al. |
| 2007/0099405 | A1 | 5/2007 | Oliva et al. |
| 2008/0251778 | A1* | 10/2008 | Chen et al. ..................... 257/4 |

OTHER PUBLICATIONS

K.N. Chen et al., Thermal Stress Evaluation of a PCRAM Material Ge2Sb2Te5, 21st IEEE Non-Volatile Semiconductor Memory Workshop, pp. 97-98 (2006).

* cited by examiner

*Primary Examiner*—Minh-Loan T Tran
(74) *Attorney, Agent, or Firm*—Vazken Alexanian; Michael J. Chang, LLC

(57) ABSTRACT

Programmable via devices and methods for the fabrication thereof are provided. In one aspect, a programmable via device is provided. The programmable via device includes a first dielectric layer; a heater over the first dielectric layer; an air gap separating at least a portion of the heater from the first dielectric layer; an isolation layer over the first dielectric layer covering at least a portion of the heater; a capping layer over a side of the isolation layer opposite the first dielectric layer; at least one programmable via extending through the capping layer and at least a portion of the isolation layer and in contact with the heater, the programmable via including at least one phase change material; a conductive cap over the programmable via; a second dielectric layer over a side of the capping layer opposite the isolation layer; a first conductive via and a second conductive via, each extending through the second dielectric layer, the capping layer and at least a portion of the isolation layer and in contact with the heater; and a third conductive via extending through the second dielectric layer and in contact with the conductive cap.

21 Claims, 11 Drawing Sheets

300

|  | Thermal conductivity (W/mK) |
|---|---|
| Air | 0.024 |
| SiO$_2$ | 1.28 |
| SiCOH | 10~20% of SiO$_2$ |

PROGRAMMABLE VIA DEVICES WITH AIR GAP ISOLATION

CROSS-REFERENCE TO RELATED APPLICATIONS

This application is related to the commonly owned U.S. application Ser. No. 11/770,455, entitled "CMOS-Process-Compatible Programmable Via Device," filed on Jun. 28, 2007, the commonly owned U.S. application Ser. No. 11/776,295, entitled "Four-Terminal Reconfigurable Devices," filed on Jul. 11, 2007, and the commonly owned U.S. application Ser. No. 11/833,321, entitled "Programmable Via Devices In Back End of Line Level," filed herewith on the same day of Aug. 3, 2007. The contents of the preceding applications are incorporated herein by reference as fully set forth herein.

FIELD OF THE INVENTION

The present invention relates to reconfigurable circuits, and more particularly, to programmable via devices and methods for fabrication thereof.

BACKGROUND OF THE INVENTION

Reconfigurable circuits have been widely used in the semiconductor industry for field programmable gate arrays (FPGAs) and for repair of a defective memory element. The FPGA consists of a set of simple, configurable logic blocks in an array with interspersed switches that can rearrange interconnections between the logic blocks.

Reconfigurable circuits are also expected to play a significant role in three-dimensional integration technology that is being currently developed. Three-dimensional integration fabricates multilayer structures that can form a single chip combination with different functionalities. In these multilayer (and multifunctional) systems, reconfigurable circuit connection is typically needed to provide controllable logic functionality, memory repair, data encryption, as well as other functions.

A programmable via is an enabling technology for high-performance reconfigurable logic applications without the trade offs in low logic gate density and power. Phase change materials are an attractive option for this application, but to date, have drawn the most attention from semiconductor memory developers as a possible replacement to flash memory.

Certain phase change materials can be switched between conductive and resistive states through varying heat applications. Reconfigurable circuits having programmable vias with phase change materials can employ heating elements to affect this change. Coordinating the heating elements with the programmable vias still presents a challenge, however, as the accuracy, effectiveness and efficiency with which the phase change material is switched directly impact on the performance of the reconfigurable circuits.

Therefore, programmable via technology that improves switching accuracy, effectiveness and efficiency would be desirable.

SUMMARY OF THE INVENTION

The present invention provides programmable via devices and methods for the fabrication thereof. In one aspect of the invention, a programmable via device is provided. The programmable via device includes a first dielectric layer; a heater over the first dielectric layer; an air gap separating at least a portion of the heater from the first dielectric layer; an isolation layer over the first dielectric layer covering at least a portion of the heater; a capping layer over a side of the isolation layer opposite the first dielectric layer; at least one programmable via extending through the capping layer and at least a portion of the isolation layer and in contact with the heater, the programmable via including at least one phase change material; a conductive cap over the programmable via; a second dielectric layer over a side of the capping layer opposite the isolation layer; a first conductive via and a second conductive via, each extending through the second dielectric layer, the capping layer and at least a portion of the isolation layer and in contact with the heater; and a third conductive via extending through the second dielectric layer and in contact with the conductive cap.

In another aspect of the invention, a method of fabricating a programmable via device over a device layer of a semiconductor chip is provided. The method includes the following steps. A first dielectric layer is deposited over the device layer. A heater is formed on a side of the first dielectric layer opposite the device layer. An air gap is formed separating at least a portion of the heater from the first dielectric layer. An isolation layer is deposited over the side of the first dielectric layer opposite the device layer so as to cover at least a portion of the heater. A first conductive via and a second conductive via are formed each extending through at least a portion of the isolation layer and in contact with the heater. A capping layer is deposited over a side of the isolation layer opposite the first dielectric layer. At least one programmable via is formed extending through the capping layer and at least a portion of the isolation layer and in contact with the heater, the programmable via including at least one phase change material. A conductive cap is formed over the programmable via. A second dielectric layer is deposited over a side of the capping layer opposite the isolation layer. The first conductive via and the second conductive via are each extended through the capping layer and through the second dielectric layer. A third conductive via is formed extending through the second dielectric layer and in contact with the conductive cap.

In yet another aspect of the invention, a method of performing a logic function is provided. The method includes the following steps. A programmable via device is provided. The programmable via device includes a first dielectric layer; a heater over the first dielectric layer; an air gap separating at least a portion of the heater from the first dielectric layer; an isolation layer over the first dielectric layer covering at least a portion of the heater; a capping layer over a side of the isolation layer opposite the first dielectric layer; at least one programmable via extending through the capping layer and at least a portion of the isolation layer and in contact with the heater, the programmable via including at least one phase change material; a conductive cap over the programmable via; a second dielectric layer over a side of the capping layer opposite the isolation layer; a first conductive via and a second conductive via, each extending through the second dielectric layer, the capping layer and at least a portion of the isolation layer and in contact with the heater; and a third conductive via extending through the second dielectric layer and in contact with the conductive cap. An OFF switching pulse is passed through the heater, when the programmable via is in a conductive state, the OFF switching pulse being configured to amorphize at least a portion of the phase change material in the programmable via to switch the programmable via to a resistive state, and/or an ON switching pulse is passed through the heater, when the programmable via is in a resistive state, the ON switching pulse being configured to anneal at least a portion of the phase change material in the programmable via to switch the programmable via to a conductive state.

In still another aspect of the invention, an integrated logic circuit is provided. The integrated logic circuit includes a plurality of logic blocks; and at least one programmable via device interconnecting two or more of the logic blocks. The programmable via device includes a first dielectric layer; a heater over the first dielectric layer; an air gap separating at least a portion of the heater from the first dielectric layer; an isolation layer over the first dielectric layer covering at least a portion of the heater; a capping layer over a side of the isolation layer opposite the first dielectric layer; at least one programmable via extending through the capping layer and at least a portion of the isolation layer and in contact with the heater, the programmable via including at least one phase change material; a conductive cap over the programmable via; a second dielectric layer over a side of the capping layer opposite the isolation layer; a first conductive via and a second conductive via, each extending through the second dielectric layer, the capping layer and at least a portion of the isolation layer and in contact with the heater; and a third conductive via extending through the second dielectric layer and in contact with the conductive cap.

In a further aspect of the invention, a semiconductor chip is provided. The semiconductor chip includes a device layer; and at least one programmable via device. The programmable via device includes a first dielectric layer over the device layer; a heater over a side of the first dielectric layer opposite the device layer; an air gap separating at least a portion of the heater from the first dielectric layer; an isolation layer over the first dielectric layer covering at least a portion of the heater; a capping layer over a side of the isolation layer opposite the first dielectric layer; at least one programmable via extending through the capping layer and at least a portion of the isolation layer and in contact with the heater, the programmable via including at least one phase change material; a conductive cap over the programmable via; a second dielectric layer over a side of the capping layer opposite the isolation layer; a first conductive via and a second conductive via, each extending through the second dielectric layer, the capping layer and at least a portion of the isolation layer and in contact with the heater; and a third conductive via extending through the second dielectric layer and in contact with the conductive cap.

A more complete understanding of the present invention, as well as further features and advantages of the present invention, will be obtained by reference to the following detailed description and drawings.

DETAILED DESCRIPTION OF PREFERRED EMBODIMENTS

Figure 1:
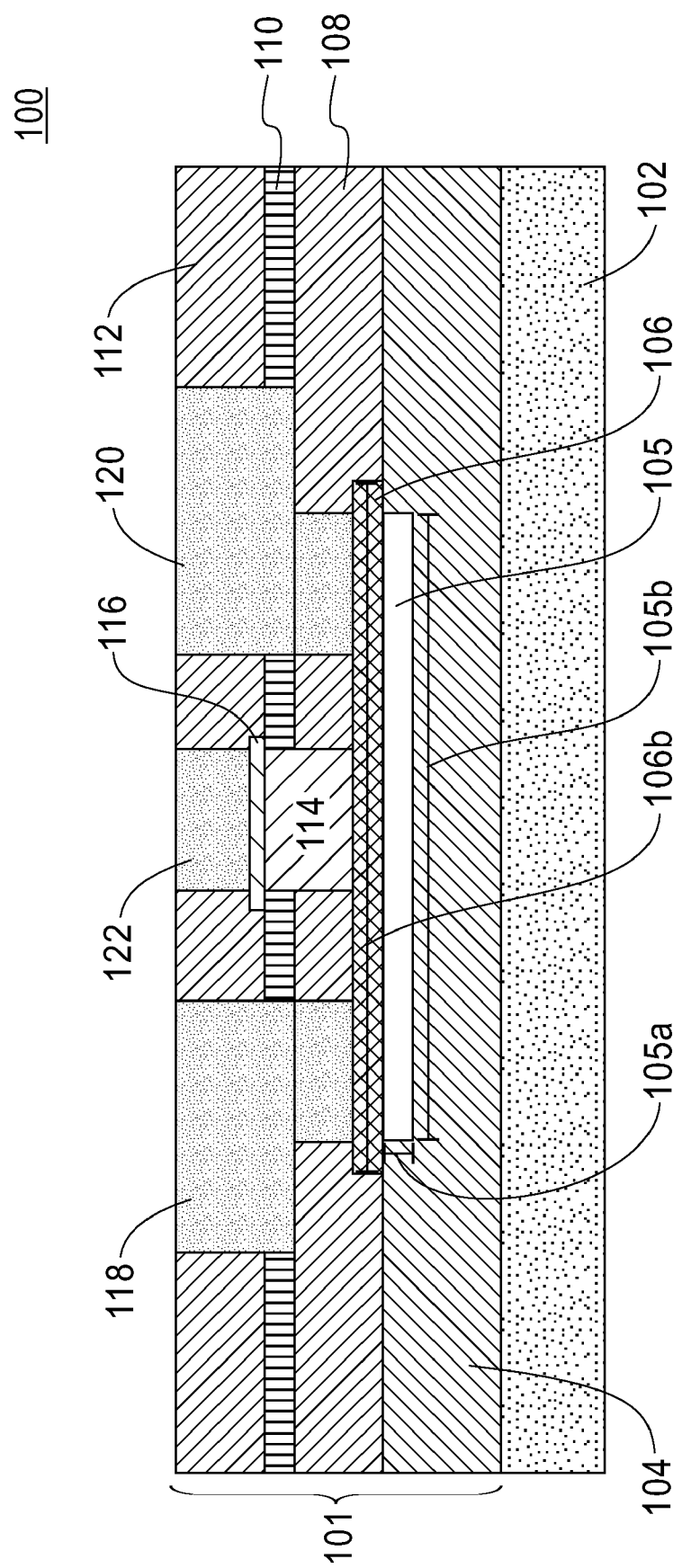
FIG. 1 is a diagram illustrating an exemplary semiconductor chip having a programmable via device over a device layer according to an embodiment of the present invention.

FIG. 1 is a diagram illustrating exemplary semiconductor chip 100. Semiconductor chip 100 includes programmable via device 101 placed in a back end of line (BEOL) level thereof, i.e., over device layer 102. According to the present teachings, programmable via device 101 is configured to be integratable with BEOL levels of a semiconductor chip.

The term "BEOL," as used herein, generally refers to a stage(s) of production of a semiconductor chip after first metallization. As such, the term "BEOL levels," as used herein, generally refers to portions, i.e., levels and/or layers, associated with a semiconductor chip after first metallization. Further, any portions, i.e., levels and/or layers, of the semiconductor chip fabricated up to, and including, first metallization (also known as front end of line "FEOL" levels) are collectively referred to herein as a "device layer(s)." Placing the programmable via device in BEOL levels of a chip is advantageous, as it prevents contamination of silicon components of the chip by the programmable via device materials, such as heater and phase change materials.

Programmable via device 101 includes dielectric layer 104, air gap 105, heater 106, isolation layer 108, capping layer 110, dielectric layer 112, programmable via 114, conductive cap 116 and conductive vias 118, 120 and 122. Specifically, dielectric layer 104 is present over device layer 102. Since, as described above, programmable via device 101 is located in BEOL levels of the chip, dielectric layer 104 includes a BEOL dielectric material, including, but not limited to hydrogenated silicon oxycarbide (SiCOH). According to an exemplary embodiment, as will be described in detail below, dielectric layer 112 can also include a BEOL dielectric material, such as SiCOH, thus surrounding each side of the programmable via device with a BEOL dielectric layer.

Heater 106 is present on a side of dielectric layer 104 opposite device layer 102. To achieve the best efficiency of electrical-thermal transformation (i.e., from heater to programmable via), according to an exemplary embodiment heater 106 includes a thin layer of a refractory material having a thickness of between about five nanometers (nm) and about 100 nm, with a relatively high resistivity of between about 100 ohm centimeter ($\Omega$cm) and about 10,000 $\Omega$cm, e.g., of between about 500 $\Omega$cm and about 3,000 $\Omega$cm. Suitable refractory materials include, but are not limited to, tantalum nitride (TaN) and metals having the formula $Ta_xSi_yN_z$, wherein x, y and z are each between zero and about one.

Air gap 105 separates at least a portion of heater 106 from dielectric layer 104. As will be described below, air gap 105 can be defined by a recess in dielectric layer 104 beneath heater 106. The formation of an air gap will be described in conjunction with the description of FIG. 2, below.

To enhance performance of a programmable via device, a heat insulator can be used around the heater to minimize heat loss during operation. Heat loss can undesirably increase an operating power of the device and/or result in switching errors. Materials such as thermal silicon oxides and high-temperature-deposition silicon oxides can be used. See, for example, U.S. application Ser. No. 11/612,631, entitled "Programmable Via Structure and Method of Fabricating Same," filed on Dec. 19, 2006. The contents of the preceding application are incorporated herein by reference. According to the present teachings, however, it is shown that air has a lower thermal conductivity, and is thus a better heat insulator, than silicon oxides. The thermal conductivity of air versus silicon dioxide ($SiO_2$) and SiCOH is highlighted in FIG. 3 (described below).

Further, as described above, dielectric layers 104 and 112 can include SiCOH. SiCOH is an organosilicate network polymer-based material that can become contaminated by materials such as metal(s) that diffuse out from the heater and/or phase change material(s) that diffuse out from the programmable via. To prevent this contamination, programmable via device 101 is configured to have heater 106 and programmable via 114 isolated from dielectric layers 104 and 112. For example, air gap 105 isolates heater 106 from dielectric layer 104 by preventing diffusion of material solids, i.e., heater metal(s), from heater 106 into dielectric layer 104.

According to an exemplary embodiment, air gap 105 has a depth 105a of between about 50 nm and about 500 nm, e.g., between about 100 nm and about 300 nm. As shown in FIG. 1, air gap 105 has a length 105b that is less than a length 106b of heater 106. As will be described, for example, in conjunction with the description of FIG. 2, below, a portion of dielectric layer 104 remains under heater 106 after air gap 105 is formed, to support heater 106 over air gap 105. Any amount of contamination from heater 106 to dielectric layer 104 by this overlap is, at most, minimal.

The heater and the programmable via are further isolated from dielectric layers 104 and 112 by isolation layer 108 which is present over the side of dielectric layer 104 opposite device layer 102. Isolation layer 108 covers heater 106 and surrounds programmable via 114, and thus prevents the diffusion of heater metal(s) and/or programmable via phase change material(s) into dielectric layers 104 and 112.

Isolation layer 108 can include any diffusion barrier material that blocks the diffusion of heater and/or programmable via phase change materials. Suitable diffusion barrier materials include, but are not limited to, one or more of amorphous hydrogenated silicon carbonitride (such as NBlok produced by Applied Materials, Santa Clara, Calif.), a low temperature oxide, silicon nitride (SiN) and amorphous silicon. Advantageously, each of these diffusion barrier materials can be utilized in accordance with BEOL process temperature requirements, e.g., so as not to cause any degradation of the BEOL dielectric materials.

Amorphous hydrogenated silicon carbonitride, which can be used to block copper (Cu) diffusion during various BEOL processes, can be deposited for BEOL structures, such as isolation layer 108, by plasma enhanced chemical vapor deposition (PECVD) at temperatures of less than about 400 degrees Celsius (° C.). According to the present teachings, low temperature oxides include oxide materials deposited at temperatures of less than about 500° C., such as $SiO_2$ which can be deposited using low pressure chemical vapor deposition (LPCVD) at temperatures of less than about 500° C. SiN, which can also be used to block Cu diffusion during various BEOL processes, can be deposited for BEOL structures, such as isolation layer 108, using PECVD at temperatures of about 400° C., or less. In addition to preventing diffusion of heater and/or programmable via phase change materials, isolation layer 108 can also prevent the ingress of external ambient gasses, such as oxygen, and moisture into the BEOL and programmable via structures during the fabrication process, and in use.

Capping layer 110 is present over a side of isolation layer 108 opposite dielectric layer 104. According to an exemplary embodiment, capping layer 110 includes SiN. SiN is a preferred capping material because of its dielectric properties and effectiveness as an etch stop during fabrication (see description below).

Programmable via 114 extends through capping layer 110 and through a portion of isolation layer 108 and is in contact with heater 106. Programmable via 114 includes a phase change material. Suitable phase change materials include, but are not limited to, one or more of ternary alloys of germanium (Ge), antimony (Sb) and tellurium (Te) (GST), such as $Ge_2Sb_2Te_5$, GeSb, $GeSb_4$, SbTe and doped derivatives thereof with substitution/addition of other elements, such as nitrogen (N) and Si. See also, U.S. application Ser. No. 11/393,270, entitled "Programmable Via Structure for Three Dimensional Integration Technology," filed on Mar. 30, 2006, now U.S. Pat. No. 7,545,667. The contents of the preceding patent are incorporated herein by reference. Reconfigurable devices having programmable vias are further described in U.S. application Ser. No. 11/770,455, entitled "CMOS-Process-Compatible Programmable Via Device," filed on Jun. 28, 2007, U.S. application Ser. No. 11/776,295, entitled "Four-Terminal Reconfigurable Devices," filed on Jul. 11, 2007, and U.S. application Ser. No. 11/833,321, entitled "Programmable Via Devices in Back End of Line Level," filed herewith on the same day of Aug. 3, 2007. The contents of the preceding applications are incorporated herein by reference.

Conductive cap 116 is present over programmable via 114. Conductive cap 116 extends laterally a distance beyond programmable via 114 to provide adequate coverage over programmable via 114, but not so far as to make contact with either of conductive vias 118 or 120. According to an exemplary embodiment, conductive cap 116 includes a titanium nitride-titanium alloy (TiN/Ti). TiN/Ti provides both a good diffusion barrier between conductive via 122 and the phase change material in programmable via 114 and good adhesion and electrical conduction between conductive via 122 and the phase change material in programmable via 114.

Dielectric layer 112 is present over a side of capping layer 110 opposite isolation layer 108. Dielectric layer 112 can have a same composition as dielectric layer 104, or a different composition from dielectric layer 104. According to an exemplary embodiment, dielectric layer 112 has the same composition as dielectric layer 104, namely SiCOH.

Each of conductive vias 118 and 120 extends through dielectric layer 112, through capping layer 110, through a portion of isolation layer 108 and is in contact with heater 106. Conductive vias 118 and 120 each include an electrically conductive material. For example, conductive vias 118 and 120 can each include any suitable standard complementary-metal-oxide semiconductor (CMOS) process metal(s), including, but not limited to, one or more of tungsten (W), tantalum (Ta), TaN, titanium (Ti), titanium nitride (TiN) and Cu. Conductive via 122 extends through dielectric layer 112 and is in contact with conductive cap 116. Conductive via 122 also includes an electrically conductive material. Like conductive vias 118 and 120, conductive via 122 can include any suitable standard CMOS process metal(s), including, but not limited to, one or more of W, Ta, TaN, Ti, TiN and Cu.

FIGS. 2A-F are diagrams illustrating exemplary methodology 200 for fabricating programmable via device 101 over device layer 102 of semiconductor chip 100. Semiconductor chip 100 having programmable via device 101 and device layer 102 is described, for example, in conjunction with the description of FIG. 1, above. The fabrication steps provided herein are CMOS process compatible, making implementation of the present techniques practical and economically viable, as well as favorable for scaled technology requirements.

In step 202, dielectric layer 104 is deposited over device layer 102. According to an exemplary embodiment, dielectric layer 104 includes SiCOH (as described above) and is deposited on device layer 102 using any suitable deposition process, including, but not limited to, chemical vapor deposition (CVD).

In step 204, heater material layer 240 is deposited over a side of dielectric layer 104 opposite device layer 102. According to an exemplary embodiment, heater material layer 240 includes a refractory material (as described above) and is deposited on dielectric layer 104 using one or more of reactive sputtering, a CVD technique (such as LPCVD) and atomic layer deposition (ALD). In step 206, heater material layer 240 is patterned to form heater 106. According to an exemplary embodiment, photolithography is used to pattern heater material layer 240, wherein a photoresist is deposited on heater material layer 240, masked and patterned with the footprint of heater 106. A conventional dry etch, such as reactive ion etching (RIE) is then used to form heater 106, with dielectric layer 104 acting as an etch stop.

In step 208, air gap 105 is formed. Air gap 105 is formed by forming a recess in dielectric layer 104 beneath a portion of heater 106. This recess can be formed in a number of ways. According to one exemplary embodiment, photolithography is used to form the recess after heater 106 has been formed, wherein a photoresist is first deposited on dielectric layer 104/heater 106, masked and patterned with the footprint and location of air gap 105. The pattern in the photoresist will have an open area with a length that is less than a length of heater 106 and a width that is greater than a width of heater 106, which will result in air gap 105 having a corresponding length that is less than a length of heater 106 and a corresponding width that is greater than a width of heater 106 (as described below). Providing an open area with a width that is greater than a width of the heater permits etching of the dielectric layer beneath the heater. Namely, an isotropic plasma etch process that selectively etches dielectric layer 104 is then used to etch dielectric layer 104 in the open area of the photoresist and under heater 106 to form the recess that defines air gap 105. A depth of etching can be controlled by controlling the time of etch, i.e., determined by etch rate calibration performed using companion samples of dielectric layer 104. Alternatively, a wet etch process, such as dilute hydrofluoric acid (DHF) can be used instead of an isotropic plasma etch, e.g., if dielectric layer 104 includes silicon oxide to provide the recess having the desired depth.

According to another exemplary embodiment, photolithography is used to form the recess prior to heater material layer 240 being deposited on dielectric layer 104 (prior to step 204, above), wherein a photoresist is first deposited on dielectric layer 104, masked and patterned with the footprint and location of air gap 105. Timed RIE is then used to etch dielectric layer 104 to form the recess that defines air gap 105. As described above, the etching time can be controlled to provide the recess having the desired depth. The width of air gap 105 will be greater than the width of heater 106, once heater 106 is formed. This permits a filler material, placed in the air gap to protect the air gap during heater formation, to be subsequently removed following heater formation. Specifically, a filler material is deposited in the recess so as to preserve the recess during heater formation. The filler material is planarized using, e.g., chemical-mechanical planarization (CMP), so that the filler material is coplanar with dielectric layer 104. In general, the filler material used is chosen based on its ability to fill the recess and to be easily removed by etching (selective to heater 106/dielectric layer 104). By way of example only, if dielectric layer 104 includes SiCOH (as described above), the filler material can include silicon oxide deposited by PECVD or spin on coating and curing. Silicon oxide can be filled and planarized by CMP, stopping efficaciously on SiCOH. Further, silicon oxide can be subsequently removed (as described below) without affecting, i.e., degrading, the materials of heater 106/dielectric layer 104.

After heater material layer 240 is deposited/heater 106 is formed (steps 204/206, respectively), the filler material can be removed by RIE, isotropic plasma etching or wet chemical etching with DHF to reveal the recess beneath heater 106 that defines air gap 105. Isotropic plasma etching and wet chemical etching with DHF will not affect the materials of heater 106/dielectric layer 104.

With either method, air gap 105 is formed having length 105b that is less than length 106b of heater 106 (to provide a support for heater 106 over air gap 105), and width 105c that is greater than width 106c of heater 106. See, for example, top-down view 208a of step 208. As will be described, for example, in conjunction with the description of step 210, below, width 105c is preferably only slightly larger than width 106c to prevent isolation layer material from being deposited in the air gap.

In step 210, isolation layer 108 is deposited over the side of dielectric layer 104 opposite device layer 102, so as to cover heater 106. According to an exemplary embodiment, isolation layer 108 includes one or more of amorphous hydrogenated silicon carbonitride, a low temperature oxide, SiN and amorphous silicon (as described above) and is deposited on dielectric layer 104 using, e.g., LPCVD or PECVD. As will be described below, according to one exemplary embodiment, a nonconformal deposition CVD technique, such as PECVD, is used to prevent isolation layer material from being deposited into the air gap. As shown in step 210, isolation layer 108 takes on the topography of heater 106 on dielectric layer 104/over air gap 105.

As described, for example, in conjunction with the description of step 208, above, air gap 105 has a width 105c that is greater than width 106c of heater 106. It is preferred, however, that width 105c of air gap 105 is only slightly larger than width 106c of heater 106, e.g., width 105c exceeds width 106c by, at most, amounts 107d and 107e (which may, or may not, be the same as one another), wherein 107d and 107e are each less than or equal to about 500 nm, e.g., less than or equal to about 300 nm. See, for example, top-down view 208a of step 208. Minimizing the amount by which the width of the air gap exceeds the width of the heater can help to limit the amount of isolation layer material that gets deposited into the air gap in step 210. Additionally, a nonconformal deposition technique, such as PECVD, can be used to further limit the amount of isolation layer material that gets deposited into the air gap in this step. Any amount of isolation material that inadvertently gets deposited into the air gap will, in any case, not be present beneath the heater, thus preserving the air gap beneath the heater.

According to the above exemplary procedures, air gap 105 will include ambient air captured beneath heater 106 by isolation layer 108. The composition of air gap 105 may, however, change over time as gasses diffuse into and/or out of air gap 105 through the various materials of the device. This exchange of gasses will not affect the function of air gap 105 as a heat insulator/diffusion barrier.

In step 212, vias 242 and 244 are formed through a portion of isolation layer 108. According to an exemplary embodiment, vias 242 and 244 are formed using photolithography, wherein a photoresist is first deposited on isolation layer 108, masked and patterned with each of the vias. RIE is then used to form vias 242 and 244, with heater 106 acting as an etch stop.

In step 214, vias 242 and 244 (formed in step 212, above) are filled with a suitable standard CMOS process metal(s), including, but not limited to, one or more of W, Ta, TaN, Ti, TiN and Cu (as described above), the metal making contact with heater 106. CMP is then used to planarize vias 242/244 and isolation layer 108.

In step 216, capping layer 110 is deposited over a side of isolation layer 108 opposite dielectric layer 104. According to an exemplary embodiment, capping layer 110 includes SiN (as described above) and is deposited over isolation layer 108 using CVD.

In step 218, via 246 is formed through capping layer 110 and through a portion of isolation layer 108. The process used to form via 246 can vary depending on the composition of isolation layer 108. For example, according to an embodiment wherein isolation layer 108 includes a low temperature oxide, via 246 is formed using photolithography in conjunction with a two-step etching process. First, a photoresist is deposited on capping layer 110, masked and patterned with the via. Nitride-selective RIE is used to form via 246 through capping layer 110, with isolation layer 108 acting as an etch stop. Oxide-selective RIE is then used to form via 246 through isolation layer 108, with heater 106 acting as an etch stop.

In step 220, via 246 (formed in step 218, above) is filled with a phase change material (as described above), the phase change material making contact with heater 106. CMP is then used to planarize the phase change material in via 246, with capping layer 110 acting as an etch stop. As such, programmable via 114 is formed and is in contact with heater 106.

In step 222, conductive capping layer 248 is deposited over a side of capping layer 110 opposite isolation layer 108. According to an exemplary embodiment, conductive capping layer 248 includes TiN/Ti (as described above) and is deposited over capping layer 110 using CVD.

In step 224, conductive capping layer 248 is patterned to form conductive cap 116 covering and extending laterally a distance beyond programmable via 114, so as to provide adequate coverage over programmable via 114. According to an exemplary embodiment, conductive cap 116 is formed using photolithography, wherein a photoresist is deposited on conductive capping layer 248, masked and patterned with the footprint and location of conductive cap 116. RIE is then used to form conductive cap 116, with capping layer 110 acting as an etch stop.

In step 226, dielectric layer 112 is deposited over the side of capping layer 110 opposite isolation layer 108. According to an exemplary embodiment, dielectric layer 112 has the same composition as dielectric layer 104, i.e., SiCOH (as described above) and is deposited over capping layer 110 using CVD.

In step 228, via 250 is formed through dielectric layer 112, and vias 252 and 254 are formed through dielectric layer 112 and capping layer 110. According to an exemplary embodiment, dielectric layer 112 includes SiCOH, capping layer 110 includes SiN and a two-step etching process is used to form vias 250, 252 and 254. Namely, a photoresist is deposited on dielectric layer 112, masked and patterned with each of the vias. Oxide-selective RIE is then used to etch vias 250 and 252/254 through dielectric layer 112, with conductive cap 116 and capping layer 110, respectively, acting as etch stops. Nitride-selective RIE is then used to etch vias 252/254 through capping layer 110.

In step 230, via 250, formed in step 228, above, is filled with a suitable standard CMOS process metal(s), including, but not limited to, one or more of W, Ta, TaN, Ti, TiN and Cu (as described above), the metal making contact with conductive cap 116. Each of vias 252 and 254, formed in step 228, above, are also filled with a suitable standard CMOS process metal(s), including, but not limited to, one or more of W, Ta, TaN, Ti, TiN and Cu (as described above). Since vias 252 and 254 in conjunction with vias 242 and 244 (formed in steps 212 and 214), respectively, will include conductive vias of the device, it is preferable that the same metal be used to fill vias 252/242 and vias 254/244.

CMP is then used to planarize the metal in each of vias 250, 252 and 254, with dielectric layer 112 acting as an etch stop. As a result, conductive via 122 is formed and is in contact with conductive cap 116, via 252 extends via 242 to form conductive via 118 and via 254 extends via 244 to form conductive via 120. Programmable via device 101 is thus formed.

Figure 2A:
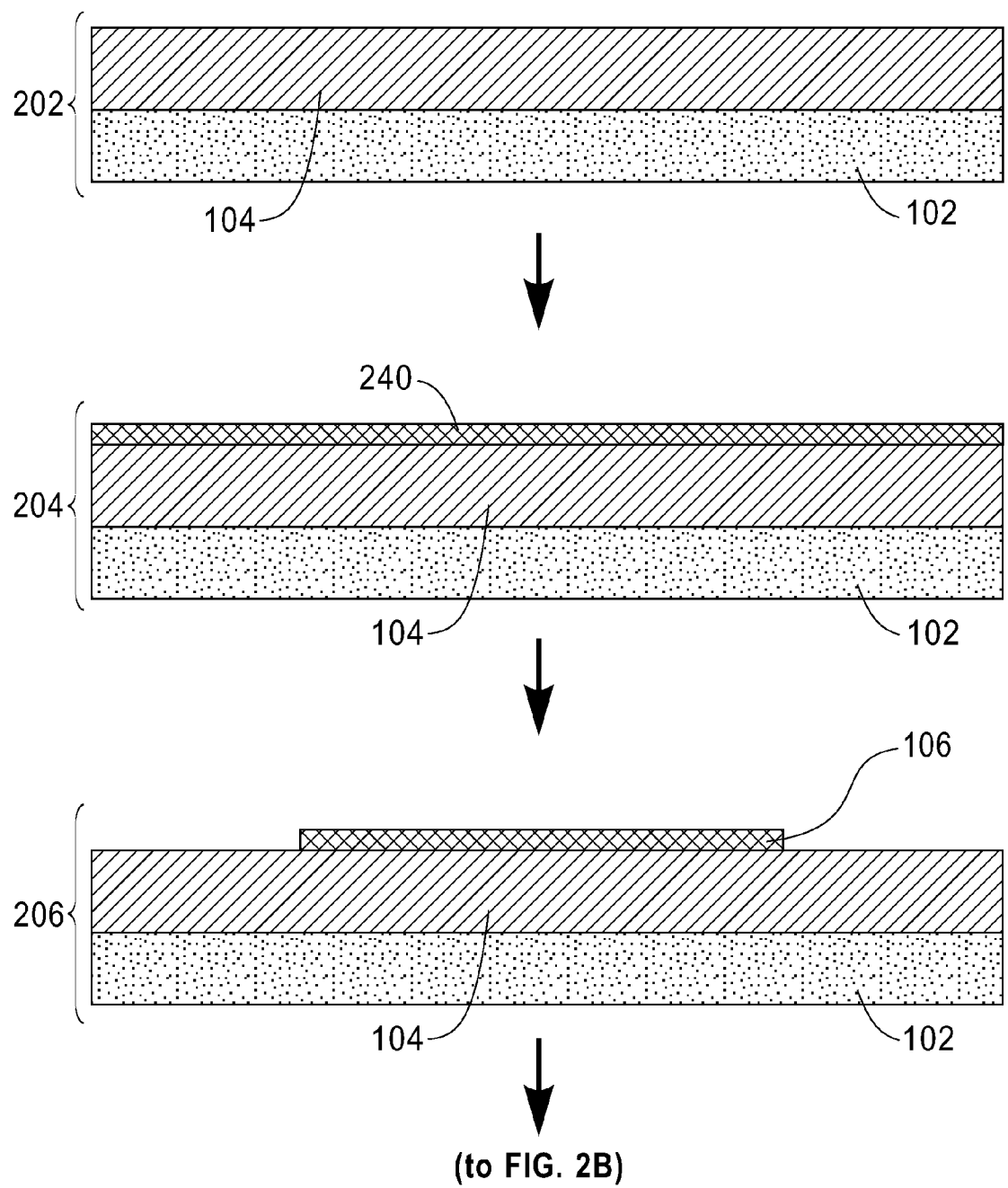
FIGS. 2A-F are diagrams illustrating an exemplary methodology for fabricating a programmable via device over a device layer of a semiconductor chip according to an embodiment of the present invention.
Figure 2B:
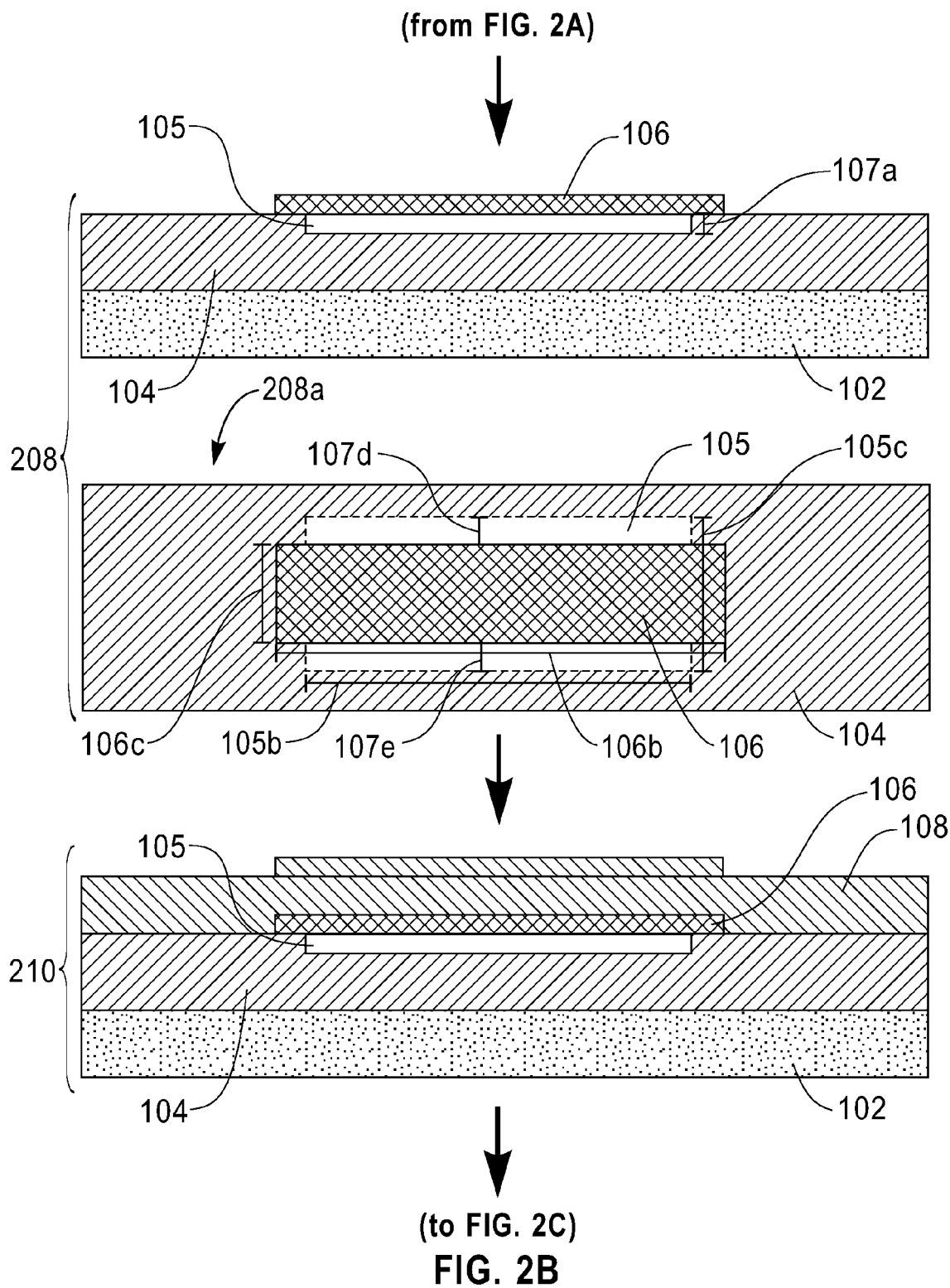
Figure 2C:
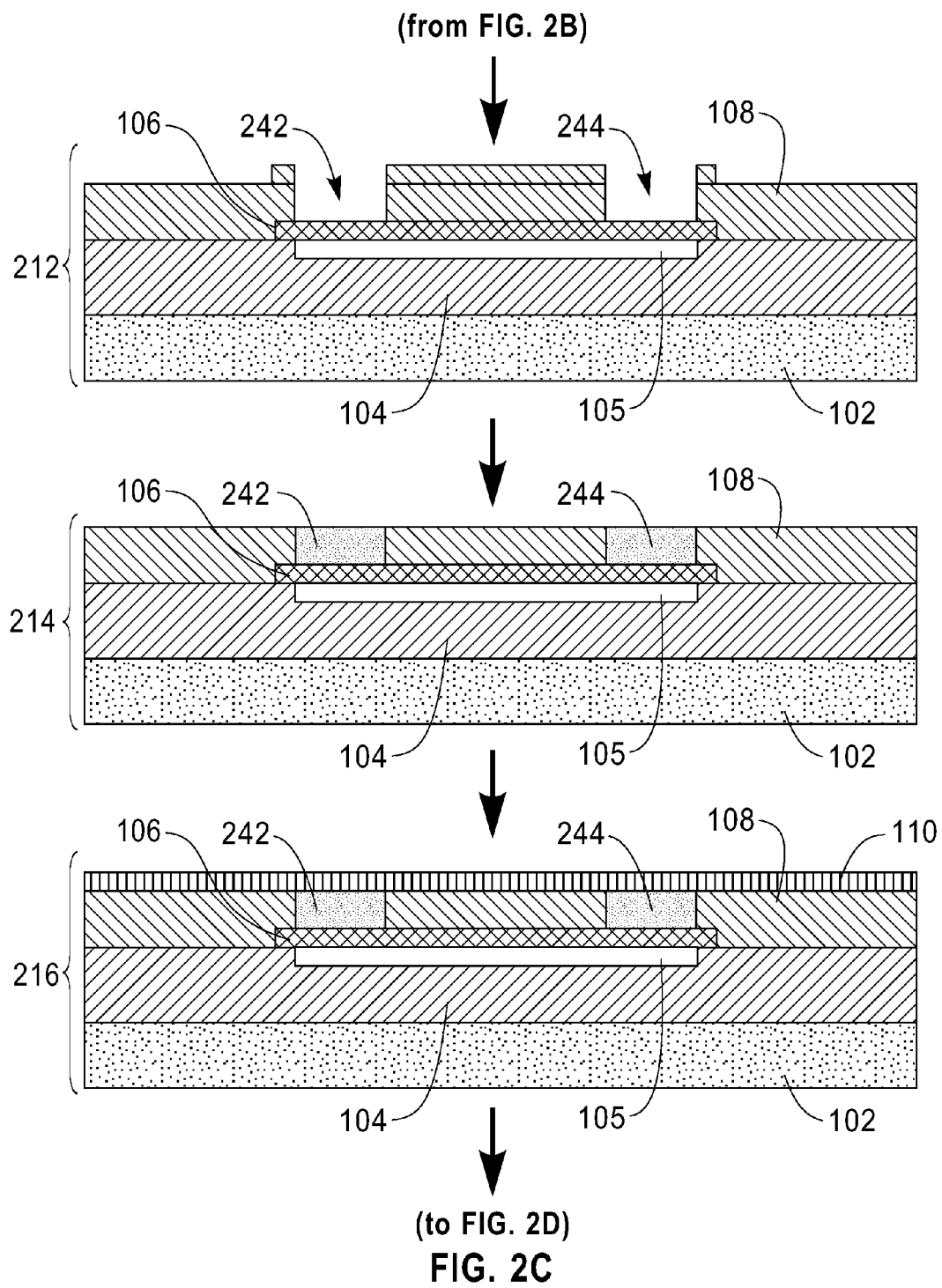
Figure 2D:
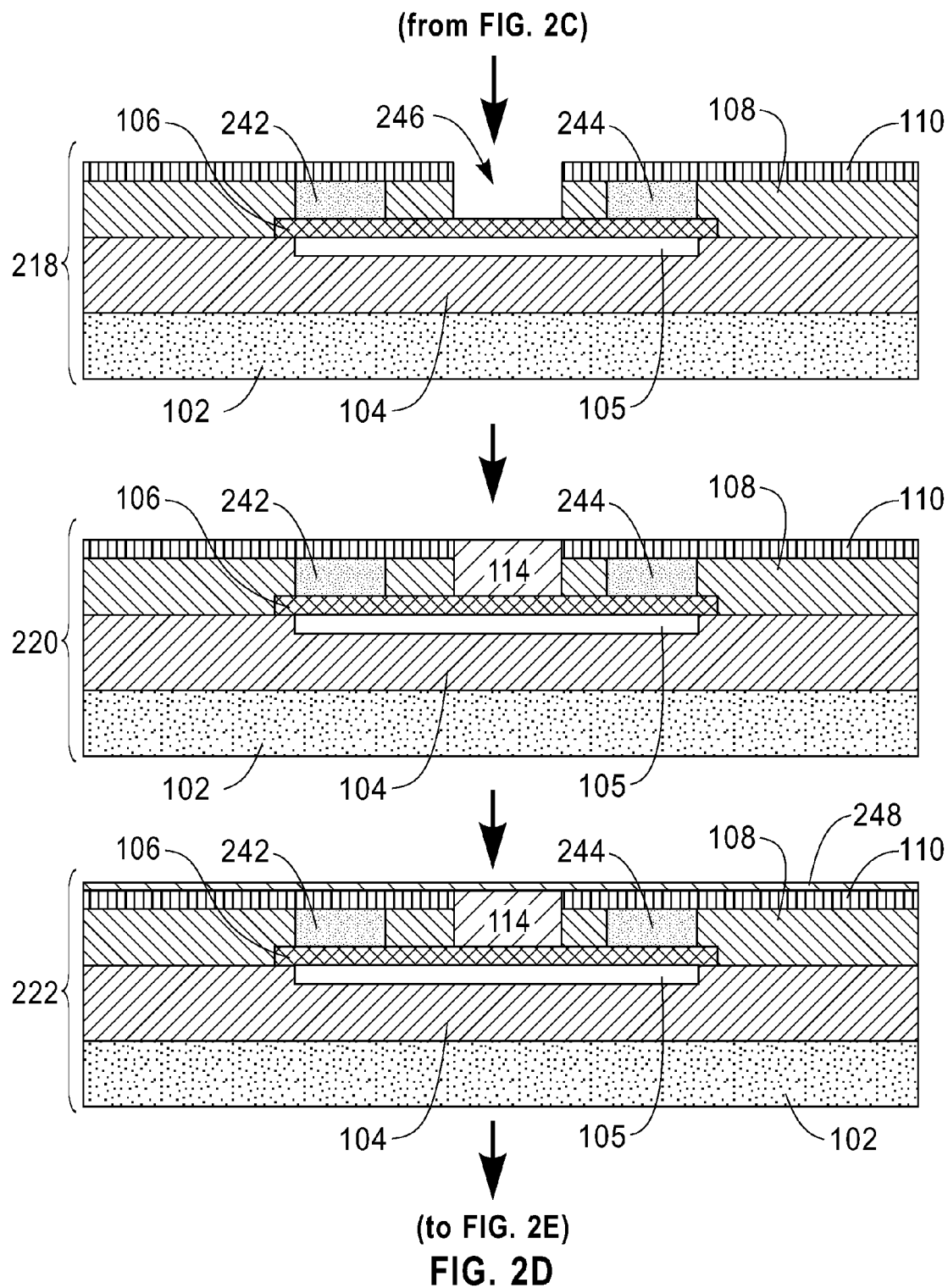
Figure 2E:
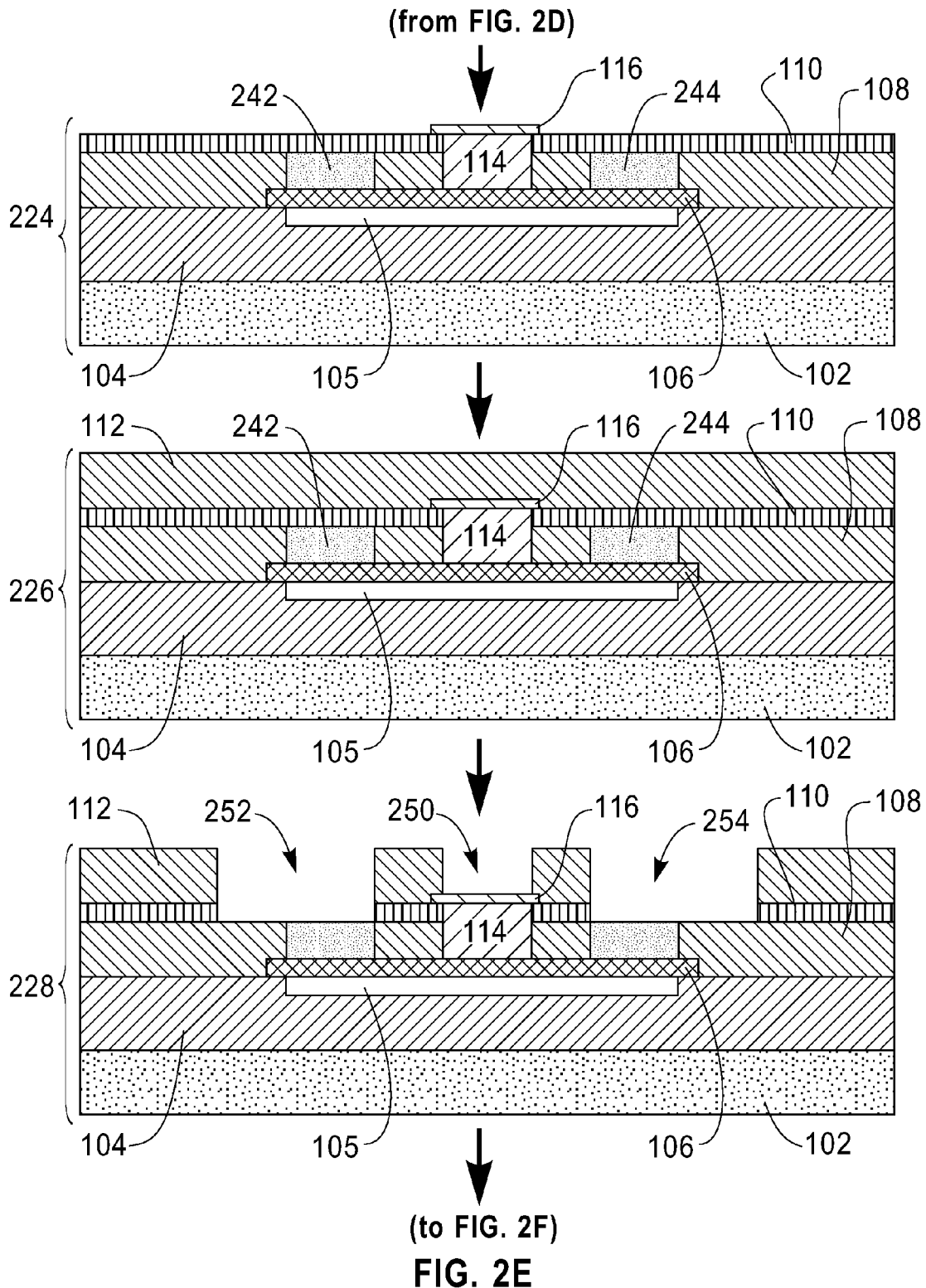
Figures 2F, 3:
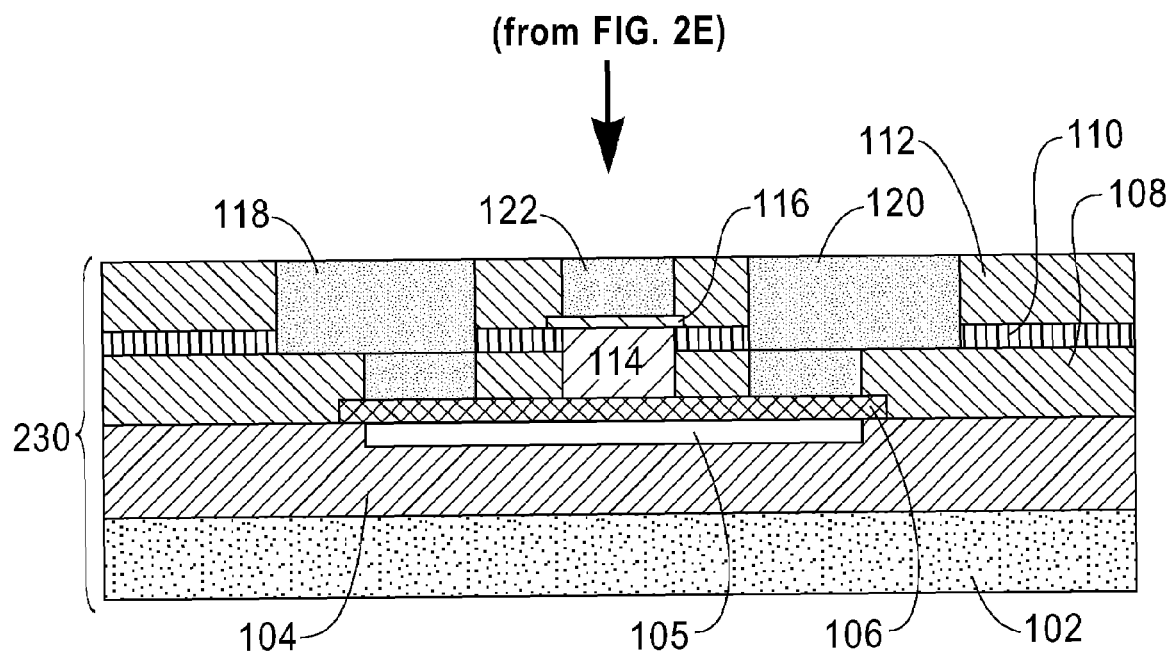
FIG. 3 is a table illustrating thermal conductivity values for several heat insulators according to an embodiment of the present invention.

FIG. 3 is table 300 illustrating thermal conductivity values (measured in Watts per meter Kelvin (W/mK)) for air, $SiO_2$ and SiCOH. As shown in table 300, air is a better heat insulator (i.e., has a lower thermal conductivity) than either $SiO_2$ or SiCOH.

Figure 4A:
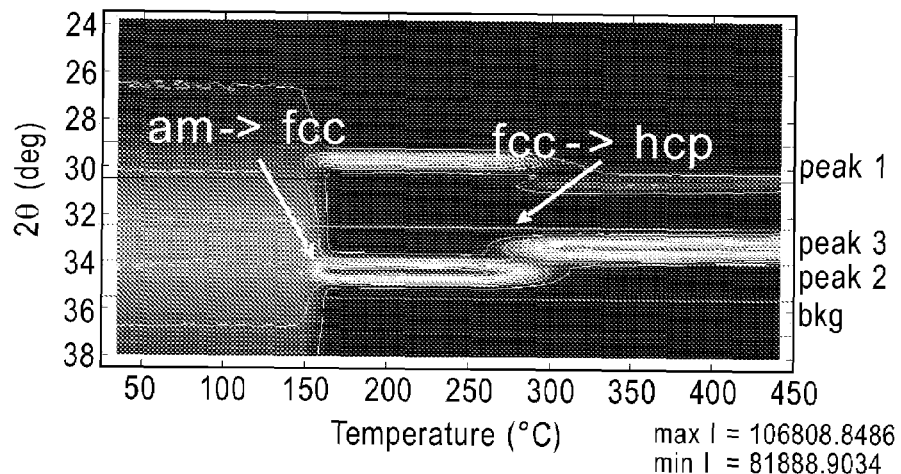
FIGS. 4A-C are graphs illustrating phase change material operation according to an embodiment of the present invention.
Figure 4B:
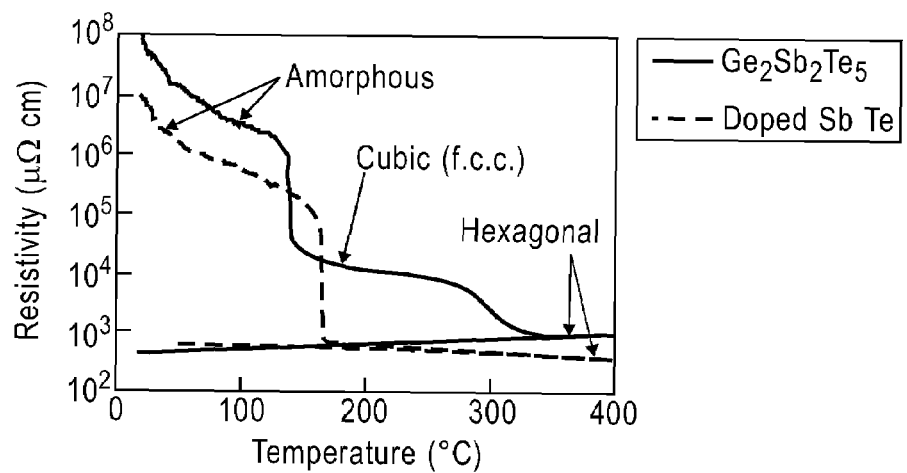
Figure 4C:
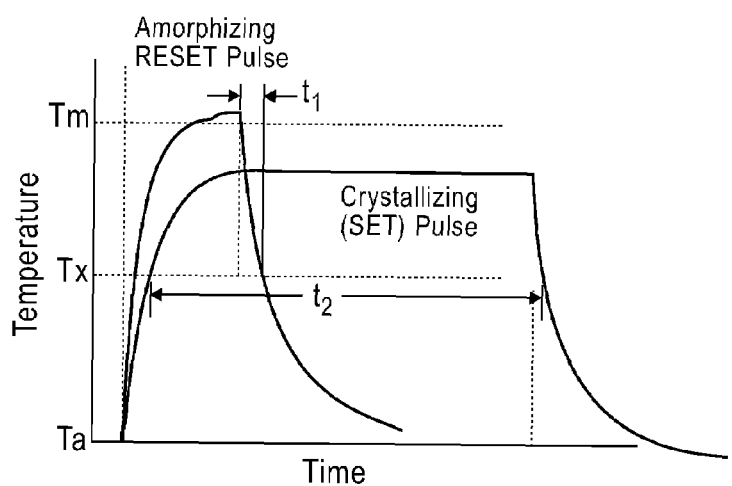

FIGS. 4A-C are graphs illustrating operation of a phase change material, such as the phase change material used in programmable via 114 of programmable via device 101, described, for example, in conjunction with the description of FIG. 1, above. FIG. 4A is a graph illustrating two theta (deg) (x-ray diffraction) evolution of the crystal structure of $Ge_2Sb_2Te_5$ from amorphous (no line), to face-centered cubic (fcc) to hexagonal close-packed (hcp) on heating (with temperature measured in ° C.). In FIG. 4A, at room temperature (e.g., about 27° C.), and up to moderately elevated temperatures (e.g., up to between about 400° C. and about 500° C.), the material is stable in two phases, a crystalline phase which is a moderately good conductor of electricity (i.e., about 200 microohms centimeter (μΩ cm)), and an amorphous phase which is insulating. FIG. 4B is a graph illustrating resistivity (measured in μΩ cm) versus temperature (measured in ° C.) for two phase change material samples, i.e., $Ge_2Sb_2Te_5$ and doped SbTe, showing different resistivities of different phases. The phases are interconverted by thermal cycling.

FIG. 4C is a graph illustrating thermal cycling for exemplary SET and RESET processes of the phase change material, as a function of temperature and time. The term "SET") and the term "RESET," as used herein, are intended to generally refer to switching the device to one of two opposite states. For example, the term "SET" may be used to describe the device being switched from an amorphous (OFF) to a crystallized (ON) state and the term "RESET" may be used to describe the device being switched from the crystallized (ON) to the amorphous (OFF) state, or vice versa. According to the exemplary embodiment shown in FIG. 4C, the thermal cycling includes a "RESET" (or OFF) pulse and a "SET" (or ON) pulse. The "RESET" (or OFF) pulse involves a conversion from crystalline to amorphous form. In this step, the temperature is raised above melting, followed by a rapid quench in a time $t_1$, as a result of which a disordered arrangement of atoms in the melt is retained. The "SET" (or ON) pulse involves an anneal at a lower temperature, for a longer time $t_2$, which enables the amorphous form to crystallize.

Figure 5:
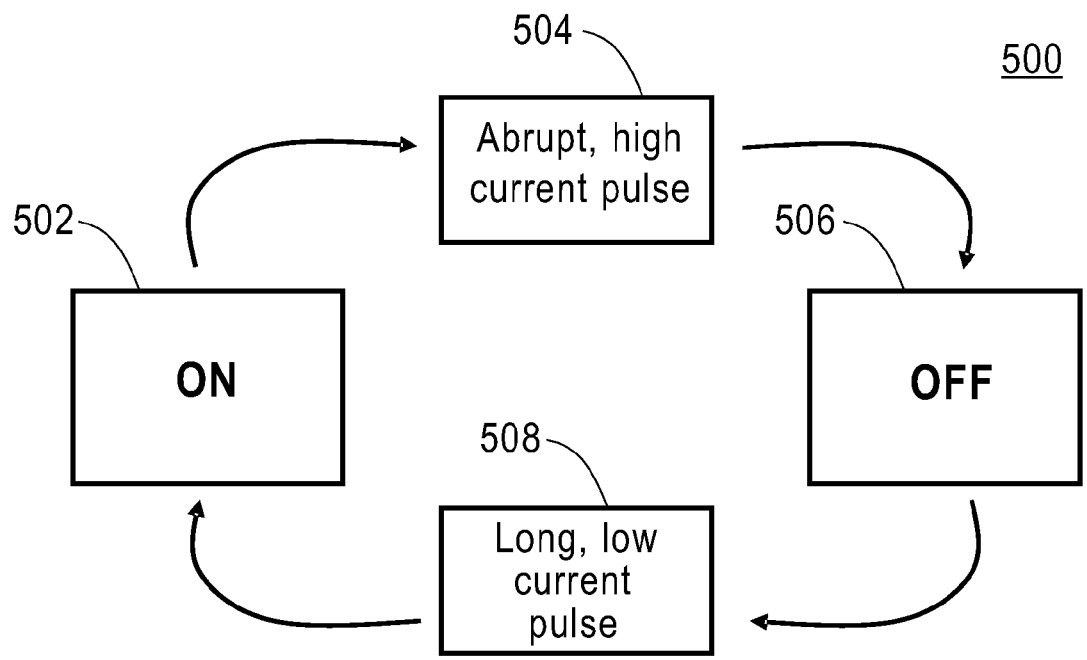
FIG. 5 is a diagram illustrating an exemplary methodology for performing a logic function with the programmable via device of FIG. 1 according to an embodiment of the present invention.

FIG. 5 is a diagram illustrating exemplary methodology 500 for performing a logic function with programmable via device 101, described, for example, in conjunction with the description of FIG. 1, above. The phase change material used in programmable via 114 can be switched between resistive (OFF-amorphous) and conductive (ON-crystalline) states by passing a current pulse through heater 106 which is in contact with a portion of programmable via 114.

Specifically, in step 502 programmable via device 101 is in an ON state. In step 504, an abrupt, e.g., a 10 nanosecond (ns) ramp up, a 50 ns plateau and a two ns ramp down, high-current, e.g., greater than one milliamp (mA), pulse is passed through heater 106 to melt and quench/amorphize a thin region of the phase change material adjacent to the heater. OFF switching pulses are described in detail in conjunction with the description of FIG. 6, below. Another exemplary OFF switching pulse can include a 19 ns ramp up, a 20 ns plateau and a two ns ramp down, at a current of greater than one mA.

As described above, the term "SET" and the term "RESET," as used herein, are intended to generally refer to switching the device to one of two opposite states. Therefore, step 504 can be either a SET or a RESET switching process. By way of example only, if step 504 is considered a SET switching process, then step 508 (described below) is a RESET switching process. Similarly, if step 504 is considered a RESET switching process, then step 508 is a SET switching process In step 506, programmable via device 101 is now in a resistive (OFF-amorphous) state, and can remain in the OFF state until switched again. In step 508, an ON switching operation is accomplished by applying a relatively low current, e.g., less than or equal to about 0.5 mA, longer pulse, e.g., a 200 ns ramp up, a 1,000 ns plateau and a 200 ns ramp down, through heater 106 to anneal the amorphous phase change material to a crystalline state. ON switching pulses are described in detail in conjunction with the description of FIG. 7, below. Programmable via device 101 is now back in the conductive (ON-crystalline) state. The state of programmable via device 101, resistive or conductive, can be read through conductive vias 120 and 122.

Figure 6:
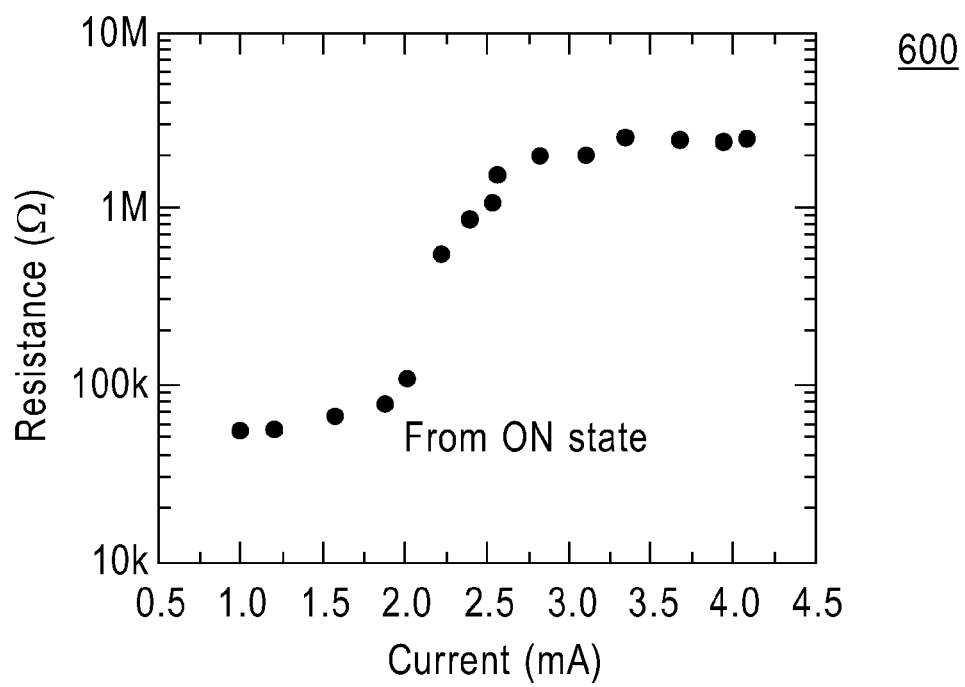
FIG. 6 is a graph illustrating resistance-current (R-I) characteristics for switching the programmable via device of FIG. 1 to an OFF state according to an embodiment of the present invention.

FIG. 6 is a graph 600 illustrating resistance-current (R-I) characteristics for switching programmable via device 101, described, for example, in conjunction with the description of FIG. 1, above, to an OFF state. According to an exemplary embodiment, 50 ns pulses with gradually increased power were applied to heater 106 from the ON state. Specifically, a 10 ns ramp up, a 50 ns plateau and a two ns ramp down were employed. After each pulse, programmable via device 101 was switched back to the ON state. When the pulse current reached about two mA, the programmable via resistance started to increase and finally reached the OFF state.

Figure 7:
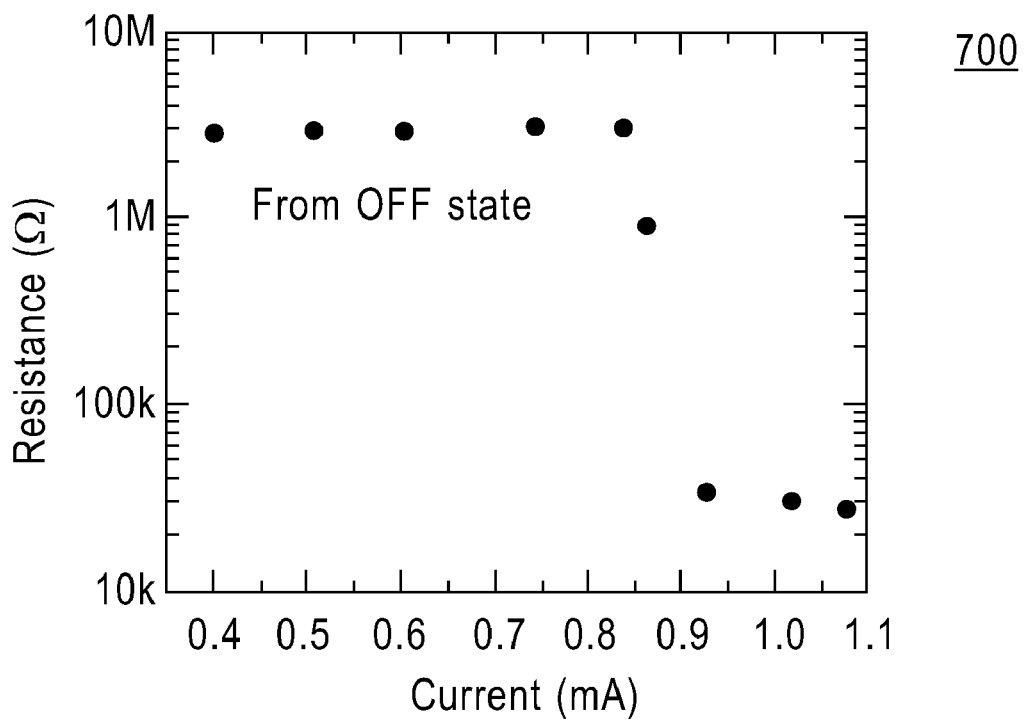
FIG. 7 is a graph illustrating R-I characteristics for switching the programmable via device of FIG. 1 to an ON state according to an embodiment of the present invention.

FIG. 7 is a graph 700 illustrating R-I characteristics for switching programmable via device 101, described, for example, in conjunction with the description of FIG. 1, above, to an ON state. Starting from an OFF state, one microsecond (μs) pulses with gradually increased power were applied to heater 106, finally implementing switching of the device to the ON state. Specifically, a 200 ns ramp up, a 1,000 ns plateau and then a 200 ns ramp down were employed.

Figure 8:
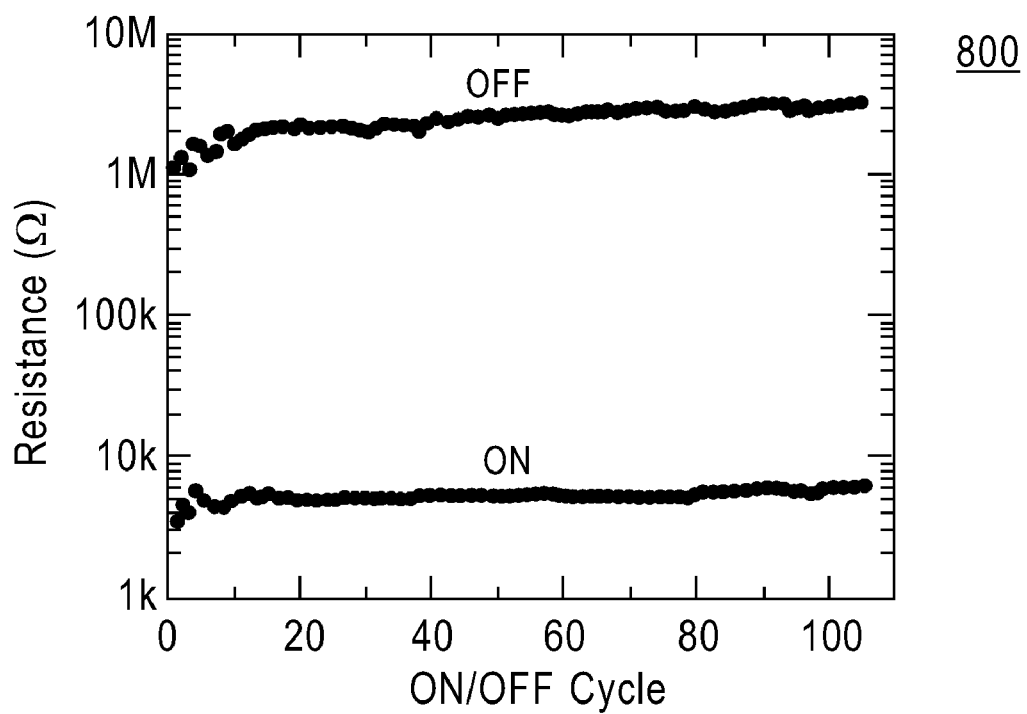
FIG. 8 is a graph illustrating cycling data from an endurance test of the programmable via device of FIG. 1 performed at room temperature according to an embodiment of the present invention.

FIG. 8 is a graph 800 illustrating cycling data from an endurance test performed on programmable via device 101, described, for example, in conjunction with the description of FIG. 1, above, at room temperature. The endurance test results show a stable sense margin without obvious degradation within the ON/OFF cycles.

Figure 9:
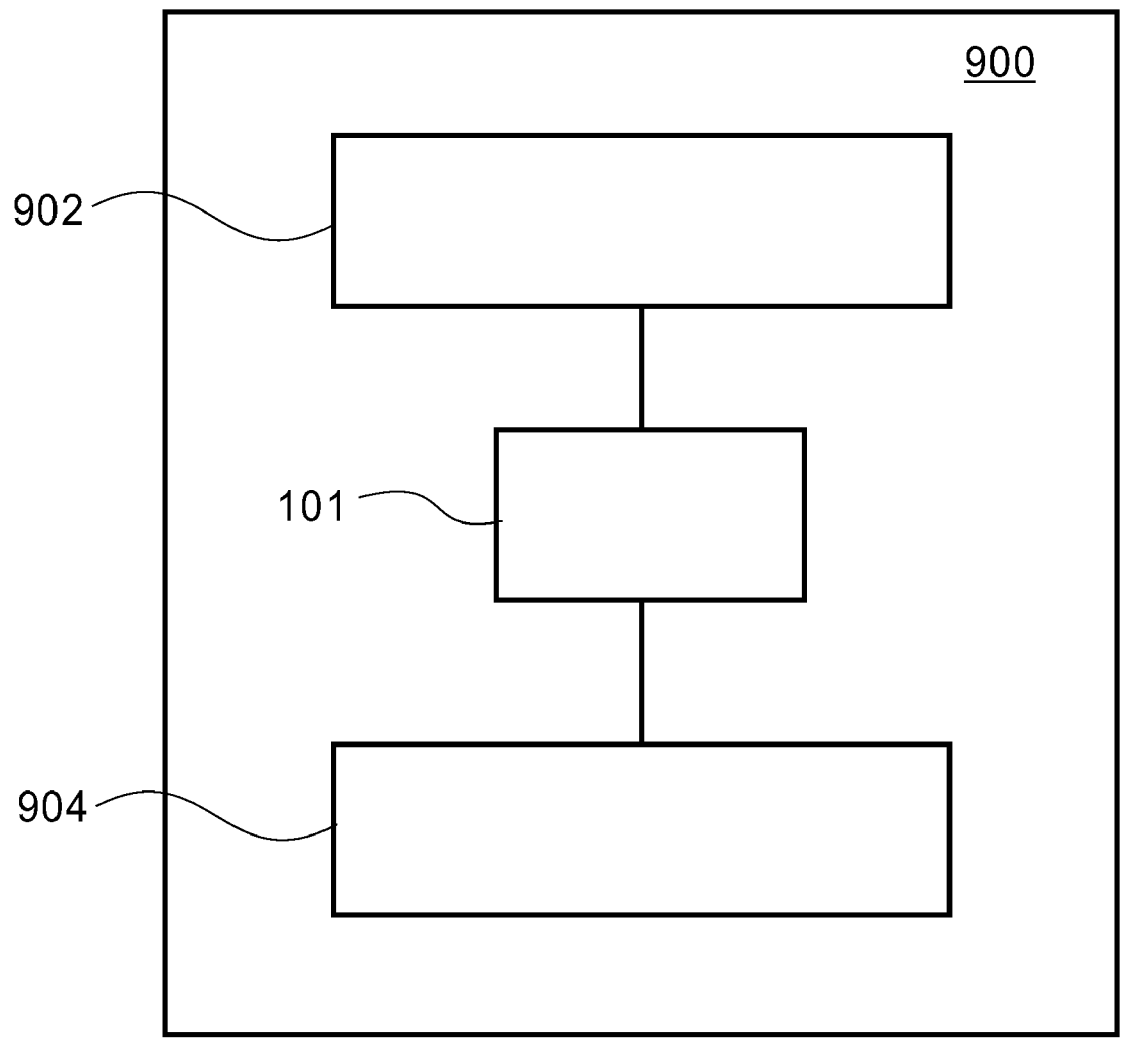
FIG. 9 is a diagram illustrating an exemplary integrated logic circuit according to an embodiment of the present invention.

FIG. 9 is a diagram illustrating exemplary integrated logic circuit 900. Integrated logic circuit 900 includes logic block 902 associated with logic block 904 by way of a programmable via device, such as programmable via device 101 described in conjunction with the description of FIG. 1, above, therebetween. Logic blocks 902 and 904 can represent some of the components present in device layer 102 of semiconductor chip 100 (described, for example, in conjunction with the description of FIG. 1, above). According to an exemplary embodiment, integrated logic circuit 900 includes a field programmable gate array (FPGA).

As described above, programmable via device 101 can be switched between a conductive and a resistive state. Thus, when programmable via device 101 is in a conductive state, logic block 902 is connected to logic block 904. Conversely, when programmable via device 101 is in a resistive state, the connection between logic blocks 902 and 904 is severed. Integrated logic circuit 900 can include a plurality of programmable via devices 101 to provide a variety of (reconfigurable) circuit configurations.

Although illustrative embodiments of the present invention have been described herein, it is to be understood that the invention is not limited to those precise embodiments, and that various other changes and modifications may be made by one skilled in the art without departing from the scope of the invention.

What is claimed is:

1. A programmable via device comprising:
a first dielectric layer;
a heater over the first dielectric layer;
an air gap separating at least a portion of the heater from the first dielectric layer;
an isolation layer over the first dielectric layer covering at least a portion of the heater;
a capping layer over a side of the isolation layer opposite the first dielectric layer;
at least one programmable via extending through the capping layer and at least a portion of the isolation layer and in contact with the heater, the programmable via comprising at least one phase change material;
a conductive cap over the programmable via;
a second dielectric layer over a side of the capping layer opposite the isolation layer;
a first conductive via and a second conductive via, each extending through the second dielectric layer, the capping layer and at least a portion of the isolation layer and in contact with the heater; and
a third conductive via extending through the second dielectric layer and in contact with the conductive cap.

2. The device of claim 1, wherein the air gap comprises a recess in the first dielectric layer beneath the heater.

3. The device of claim 1, wherein the air gap has a depth of between about 100 nanometers and about 300 nanometers.

4. The device of claim 1, wherein the air gap has a length that is less than a length of the heater.

5. The device of claim 1, wherein one or more of the first dielectric layer and the second dielectric layer comprise hydrogenated silicon oxycarbide.

6. The device of claim 1, wherein the isolation layer comprises one or more of amorphous hydrogenated silicon carbonitride, a low temperature oxide, silicon nitride and amorphous silicon.

7. The device of claim 1, wherein the heater comprises at least one refractory material.

8. The device of claim 7, wherein the refractory material comprises one or more of tantalum nitride and a metal having a formula $Ta_xSi_yN_z$, wherein x, y and z are each between zero and about one.

9. The device of claim 7, wherein the refractory material has a resistivity of between about 500 ohm centimeter and about 3,000 ohm centimeter.

10. The device of claim 1, wherein the heater has a thickness of between about five nanometers and about 100 nanometers.

11. The device of claim 1, wherein the capping layer comprises silicon nitride.

12. The device of claim 1, wherein the phase change material comprises one or more of ternary alloys of germanium (Ge), antimony (Sb) and tellurium (Te) (GST), $Ge_2Sb_2Te_5$, GeSb, $GeSb_4$, SbTe and derivatives thereof doped with one or more of nitrogen and silicon.

13. The device of claim 1, wherein the conductive cap comprises a titanium nitride-titanium alloy.

14. The device of claim 1, wherein the first conductive via, the second conductive via and the third conductive via each comprise one or more of one or more of tungsten, tantalum, tantalum nitride, titanium, titanium nitride and copper.

15. A method of fabricating a programmable via device over a device layer of a semiconductor chip, the method comprising the steps of:
   depositing a first dielectric layer over the device layer;
   forming a heater on a side of the first dielectric layer opposite the device layer;
   forming an air gap separating at least a portion of the heater from the first dielectric layer;
   depositing an isolation layer over the side of the first dielectric layer opposite the device layer so as to cover at least a portion of the heater;
   forming a first conductive via and a second conductive via each extending through at least a portion of the isolation layer and in contact with the heater;
   depositing a capping layer over a side of the isolation layer opposite the first dielectric layer;
   forming at least one programmable via extending through the capping layer and at least a portion of the isolation layer and in contact with the heater, the programmable via comprising at least one phase change material;
   forming a conductive cap over the programmable via;
   depositing a second dielectric layer over a side of the capping layer opposite the isolation layer;
   extending the first conductive via and the second conductive via each through the capping layer and through the second dielectric layer; and
   forming a third conductive via extending through the second dielectric layer and in contact with the conductive cap.

16. The method of claim 15, wherein the step of forming the air gap further comprises the steps of:
   providing a pattern for the air gap on the heater and first dielectric layer, the pattern comprising an open area having a width that is greater than a width of the heater and a length that is less than a length of the heater;
   using the open area of the pattern to form a recess in the first dielectric layer beneath the heater using one or more of isotropic plasma etching and wet chemical etching.

17. The method of claim 15, wherein the step of forming the air gap further comprises the steps of:
   forming a recess in the first dielectric prior to forming the heater;
   filling the recess with a filler material;
   planarizing the filler material; and
   removing the filler material from the recess after the heater is formed by one or more of reactive ion etching, isotropic plasma etching and wet chemical etching.

18. The method of claim 17, wherein the filler material comprises silicon oxide.

19. A method of performing a logic function, the method comprising the steps of:
   providing a programmable via device comprising:
      a first dielectric layer;
      a heater over the first dielectric layer;
      an air gap separating at least a portion of the heater from the first dielectric layer;
      an isolation layer over the first dielectric layer covering at least a portion of the heater;
      a capping layer over a side of the isolation layer opposite the first dielectric layer;
      at least one programmable via extending through the capping layer and at least a portion of the isolation layer and in contact with the heater, the programmable via comprising at least one phase change material;
      a conductive cap over the programmable via;
      a second dielectric layer over a side of the capping layer opposite the isolation layer;
      a first conductive via and a second conductive via, each extending through the second dielectric layer, the capping layer and at least a portion of the isolation layer and in contact with the heater; and
      a third conductive via extending through the second dielectric layer and in contact with the conductive cap; and
   passing one or more of:
      an OFF switching pulse through the heater, when the programmable via is in a conductive state, the OFF switching pulse being configured to amorphize at least a portion of the phase change material in the programmable via to switch the programmable via to a resistive state, and
      an ON switching pulse through the heater, when the programmable via is in a resistive state, the ON switching pulse being configured to anneal at least a portion of the phase change material in the programmable via to switch the programmable via to a conductive state.

20. An integrated logic circuit comprising:
   a plurality of logic blocks; and
   at least one programmable via device interconnecting two or more of the logic blocks, the programmable via device comprising:
      a first dielectric layer;
      a heater over the first dielectric layer;
      an air gap separating at least a portion of the heater from the first dielectric layer;
      an isolation layer over the first dielectric layer covering at least a portion of the heater;
      a capping layer over a side of the isolation layer opposite the first dielectric layer;
      at least one programmable via extending through the capping layer and at least a portion of the isolation layer and in contact with the heater, the programmable via comprising at least one phase change material;
a conductive cap over the programmable via;
a second dielectric layer over a side of the capping layer opposite the isolation layer;
a first conductive via and a second conductive via, each extending through the second dielectric layer, the capping layer and at least a portion of the isolation layer and in contact with the heater; and
a third conductive via extending through the second dielectric layer and in contact with the conductive cap.

21. A semiconductor chip, comprising:
a device layer; and
at least one programmable via device, the programmable via device comprising:
  a first dielectric layer over the device layer;
  a heater over a side of the first dielectric layer opposite the device layer;
  an air gap separating at least a portion of the heater from the first dielectric layer;
  an isolation layer over the first dielectric layer covering at least a portion of the heater;
  a capping layer over a side of the isolation layer opposite the first dielectric layer;
  at least one programmable via extending through the capping layer and at least a portion of the isolation layer and in contact with the heater, the programmable via comprising at least one phase change material;
  a conductive cap over the programmable via;
  a second dielectric layer over a side of the capping layer opposite the isolation layer;
  a first conductive via and a second conductive via, each extending through the second dielectric layer, the capping layer and at least a portion of the isolation layer and in contact with the heater; and
  a third conductive via extending through the second dielectric layer and in contact with the conductive cap.

* * * * *